United States Patent
Linnen et al.

(10) Patent No.: US 10,991,447 B2
(45) Date of Patent: Apr. 27, 2021

(54) CLOCK FREQUENCY COUNTING DURING HIGH-VOLTAGE OPERATIONS FOR IMMEDIATE LEAKAGE DETECTION AND RESPONSE

(71) Applicant: SanDisk Technologies LLC, Addison, TX (US)

(72) Inventors: Daniel Linnen, San Jose, CA (US); Avinash Rajagiri, San Jose, CA (US); Dongxiang Liao, San Jose, CA (US); Kirubakaran Periyannan, San Jose, CA (US)

(73) Assignee: SanDisk Technologies LLC, Addison, TX (US)

( * ) Notice: Subject to any disclaimer, the term of this patent is extended or adjusted under 35 U.S.C. 154(b) by 0 days.

(21) Appl. No.: 16/451,421

(22) Filed: Jun. 25, 2019

(65) Prior Publication Data

US 2020/0411131 A1    Dec. 31, 2020

(51) Int. Cl.
| | | |
|---|---|---|
| *G11C 29/56* | (2006.01) | |
| *G06F 11/16* | (2006.01) | |
| *G11C 16/32* | (2006.01) | |
| *G11C 5/14* | (2006.01) | |

(52) U.S. Cl.
CPC .... *G11C 29/56012* (2013.01); *G06F 11/1604* (2013.01); *G11C 5/145* (2013.01); *G11C 16/32* (2013.01)

(58) Field of Classification Search
CPC ... G11C 29/56012; G11C 16/32; G11C 5/145; G06F 11/1604
See application file for complete search history.

(56) References Cited

U.S. PATENT DOCUMENTS

| | | | | |
|---|---|---|---|---|
| 7,551,702 B2* | 6/2009 | Hauser | | G06F 1/12 |
| | | | | 340/4.2 |
| 2011/0057696 A1* | 3/2011 | Hsieh | | H03L 7/099 |
| | | | | 327/157 |
| 2019/0147961 A1* | 5/2019 | Lee | | G11C 16/08 |
| | | | | 365/185.05 |

* cited by examiner

*Primary Examiner* — Thien Nguyen
(74) *Attorney, Agent, or Firm* — Dickinson Wright PLLC; Steven Hurles

(57) ABSTRACT

A method for detecting faults in a memory system includes performing an operation on at least one memory cell of the memory system. The method also includes receiving, during performance of the operation, a first clock cycle count for a first pulse of a charge pump associated with the at least one memory cell. The method also includes receiving, during performance of the operation, a second clock cycle count for a second pulse of the charge pump. The method also includes determining whether a fault will occur based on a difference between the first clock cycle count and the second clock cycle count.

19 Claims, 7 Drawing Sheets

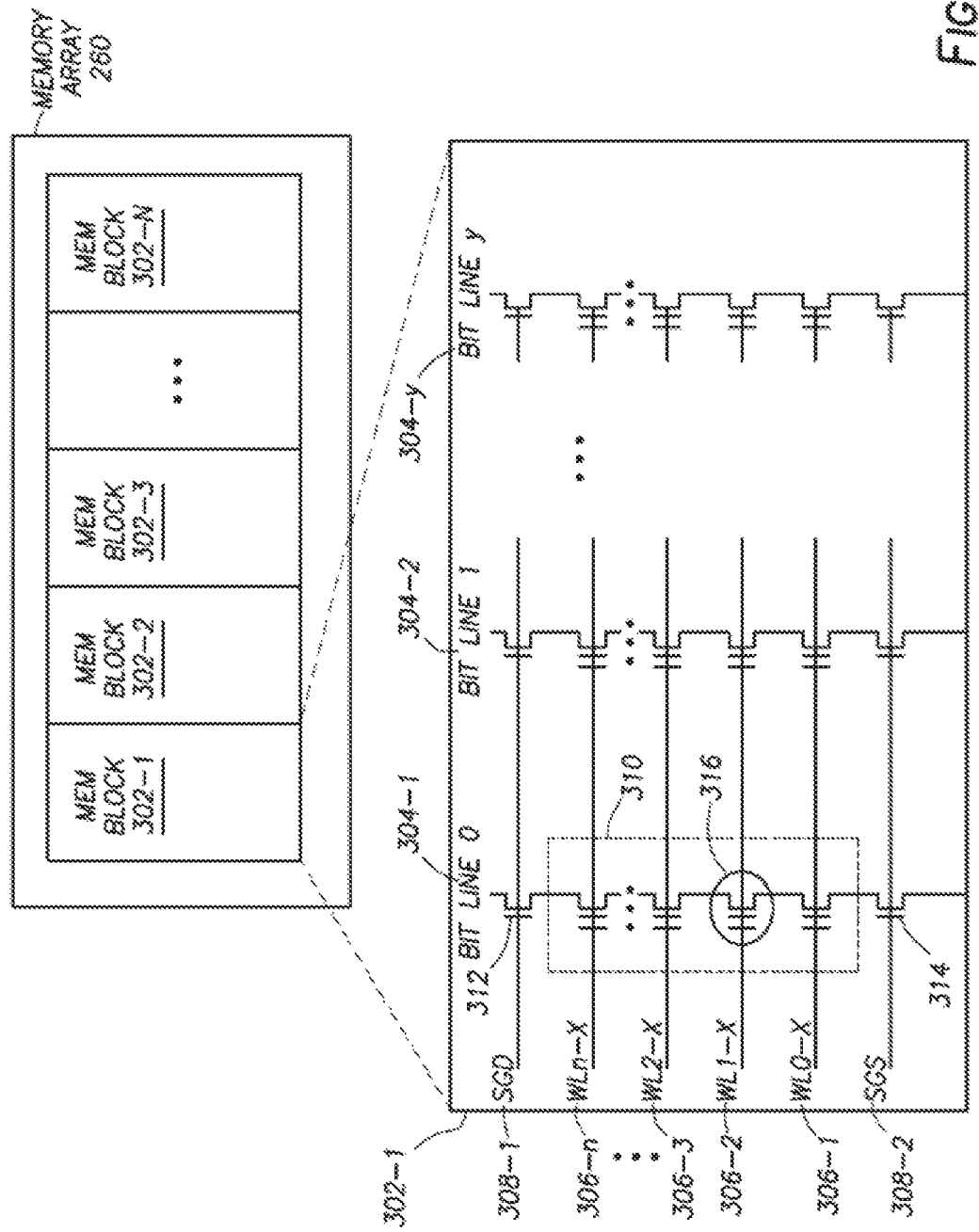

CLOCK FREQUENCY COUNTING DURING HIGH-VOLTAGE OPERATIONS FOR IMMEDIATE LEAKAGE DETECTION AND RESPONSE

TECHNICAL FIELD

This disclosure relates to memory systems and in particular to systems and methods for counting charge pump clock cycles during high-voltage operations for immediate leakage detection and response.

BACKGROUND

Non-volatile memory systems are a type of memory that retains stored information without requiring an external power source. Non-volatile memory is widely used in various electronic devices and in stand-alone memory devices. For example, non-volatile memory can be found in laptops, digital audio player, digital cameras, smart phones, video games, scientific instruments, industrial robots, medical electronics, solid-state drives, USB drives, memory cards, and the like. Non-volatile memory can be electronically programmed/reprogrammed and erased.

During performance of high-voltage operations, such as programming operations, on memory cells of such memory systems, various faults, such as memory leakage or other faults, may occur within the memory system. Typically, such faults are detected after the faults occur, which may lead to component damage and/or data loss in the memory system. Additionally, a response to such faults is typically initiated after component damage and/or data loss occurs.

SUMMARY

This disclosure relates generally to memory management systems and methods.

An aspect of the disclosed embodiments is a method for detecting faults in a memory system. The method includes performing an operation on at least one memory cell of the memory system. The method also includes receiving, during performance of the operation, a first clock cycle count for a first pulse of a charge pump associated with the at least one memory cell. The method also includes receiving, during performance of the operation, a second clock cycle count for a second pulse of the charge pump. The method also includes determining whether a fault will occur based on a difference between the first clock cycle count and the second clock cycle count.

Another aspect of the disclosed embodiments is a controller that includes a bus interface and a processor. The bus interface is in communication with at least one charge pump clock counter associated with a charge pump. The processor is in communication with the bus and configured to: perform an operation on at least one memory cell of a memory system associated with the controller; receive, during performance of the operation, a first clock cycle count for a first pulse of the charge pump; receive, during performance of the operation, a second clock cycle count for a second pulse of the charge pump; and determine whether a fault will occur based on a difference between the first clock cycle count and the second clock cycle count.

Another aspect of the disclosed embodiments is a fault determination circuit that includes a charge pump clock cycle counter configured to count clock cycles of a charge pump associated with a memory system. The circuit also includes a first register that receives a first clock cycle count from the charge pump clock cycle counter, wherein the first clock cycle count corresponds to a first pulse of the charge pump. The circuit also includes a second register that receives a second clock cycle count from the charge pump clock cycle counter, wherein the second clock cycle count corresponds to a second pulse of the charge pump. The circuit also includes a magnitude comparator configured to compare the first clock cycle count to the second clock cycle count.

These and other aspects of the present disclosure are disclosed in the following detailed description of the embodiments, the appended claims, and the accompanying figures.

BRIEF DESCRIPTION OF THE DRAWINGS

The disclosure is best understood from the following detailed description when read in conjunction with the accompanying drawings. It is emphasized that, according to common practice, the various features of the drawings are not to-scale. On the contrary, the dimensions of the various features are arbitrarily expanded or reduced for clarity.

FIG. 3 generally illustrates a memory block according to the principles of the present disclosure.

DETAILED DESCRIPTION

Figure 1A:
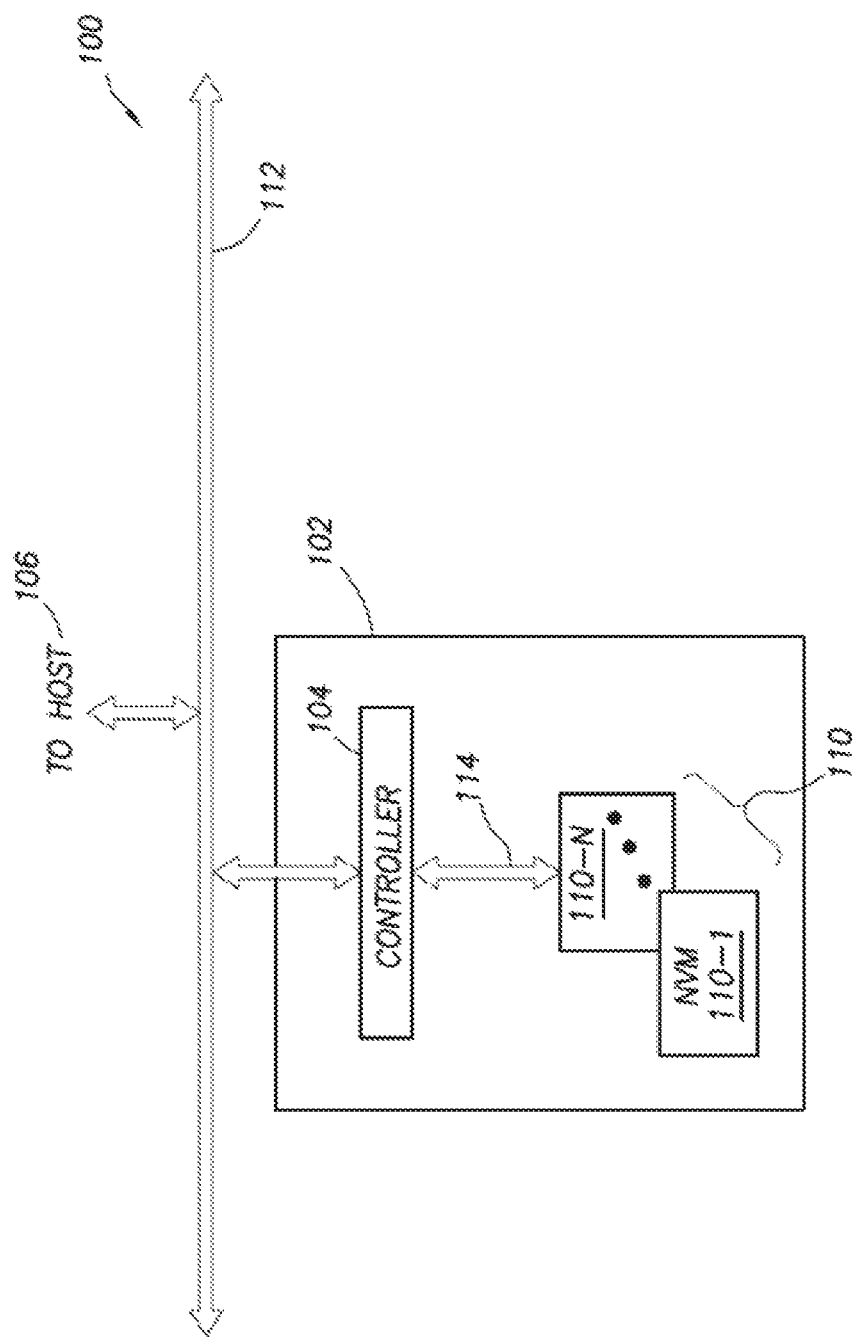
FIGS. 1A-1B generally illustrates a block diagram of an example non-volatile memory system according to the principles of the present disclosure.

The following discussion is directed to various embodiments of the invention. Although one or more of these embodiments may be preferred, the embodiments disclosed should not be interpreted, or otherwise used, as limiting the scope of the disclosure, including the claims. In addition, one skilled in the art will understand that the following description has broad application, and the discussion of any embodiment is meant only to be exemplary of that embodiment, and not intended to intimate that the scope of the disclosure, including the claims, is limited to that embodiment.

As described, non-volatile memory systems are a type of memory that retains stored information without requiring an external power source. Non-volatile memory is widely used in various electronic devices and in stand-alone memory devices. For example, non-volatile memory can be found in laptops, digital audio player, digital cameras, smart phones, video games, scientific instruments, industrial robots, medical electronics, solid-state drives, USB drives, memory cards, and the like. Non-volatile memory can be electronically programmed/reprogrammed and erased.

During performance of high-voltage operations on memory cells of such a memory system, a charge pump associated with the memory system may increase or decrease a supply voltage and provide voltage pulses (e.g., using the increased or decreased voltage) to the memory cells. For example, the charge pump may double the voltage from the supply voltage, triple the voltage from the supply voltage, half the voltage from the supply voltage, or increase or decrease the voltage from the supply voltage to any suitable factor of the supply voltage in order to generate voltage pulses at a voltage required for programming the memory cells.

In some embodiments, the charge pump is connected to one or more capacitors. For example, the charge pump may be connected to the one or more capacitors in parallel or series. In some embodiments, the charge pump may be connected to some capacitors in parallel and some capacitors in series. During a first pulse of the charge pump operation, the charge pump, using the supply voltage, may charge the one or more capacitors (e.g., bringing the capacitor to the same voltage as the supply voltage). The charge pump may include or be connected to a suitable switching device.

The charge pump may use the switching device to reconfigure the connection between the charge pump and the one or more capacitors, which may change the way the one or more capacitors are connected to the charge pump (e.g., from series to parallel, parallel to series, or a combination thereof). During a second pulse of the charge pump, the charge pump may then supply voltage from the voltage supply to the one or more capacitors (e.g., being charged to the voltage of the voltage supply) which may double the voltage at the one or more capacitors. It should be understood that the charge pump may be connected to any number of capacitors in any suitable fashion and may use the supply voltage and the switching mechanism to charge the capacitors to any suitable voltage. Additionally, or alternatively, the charge pump may use any number of pulses to charge the capacitors. A controller associated with the memory system may use the voltage stored in the capacitors by the charge pump to program the memory cells.

During performance of the operations on the memory cells, various faults, such as memory leakage or other faults, may occur within the memory system. Typically, such faults are detected after the faults occur, which may lead to component damage and/or data loss in the memory system. Additionally, a response to such faults is typically initiated after component damage and/or data loss occurs.

Accordingly, systems and methods, such as those described herein, that identify potential faults in the memory system before the faults occur and that respond (e.g., execute a corrective action) to reduce or prevent component damage and/or data loss, may be desirable. In some embodiments, the systems and methods described herein may us clock cycle counts associated with the charge pump to determine that a fault may occur in the memory system. In some embodiments, the systems and methods described herein may compare a current clock cycle count with a previous clock cycle count and, in response to the difference between the current clock cycle count and the previous clock cycle count being above a threshold, determine that a fault is likely to occur. In some embodiments, the systems and methods described herein may determine, based on the clock cycle counts, that the charge pump was continuously on a full duty cycle, which may indicate that the charge pump was unable to reach a target voltage (e.g., the voltage required by the controller to perform the operation on the memory cells). This may indicate that a strong short exists in the memory system.

In some embodiments, the systems and methods described herein may compare the clock cycle counts mid pulse (e.g., before a cycle of the charge pump ends) and, in response to a determination that current clock cycle count (e.g., the number of clock cycle counts determined at substantially the middle of the current pulse) is substantially larger than the previous clock cycle count (e.g., the difference between the clock cycle counts is above a threshold), determine that a fault is likely to occur in the memory system.

In some embodiments, the systems and methods described herein may initial a corrective action in response to the determination that a fault will occur in the memory system. For example, the systems and methods described herein may suspend the operation being performed on the memory cells, may shut the charge pump off either at the end of a cycle or mid-pulse using the determination as feedback within the charge pump, may set a flag or other indication indicating that a fault will occur, take other suitable corrective action, or a combination thereof.

FIG. 1A illustrates a block diagram of an example system architecture 100 including non-volatile memory. In particular, the example system architecture 100 includes storage system 102 (e.g., which may be referred to as a memory system), a controller 104, and a host 106. In various embodiments, the host 106 can include any device or system that utilizes the storage system 102. In some embodiments, various aspects of the controller 104 may be implemented by the host 106 or the host 106 can include its own controller (e.g., a processor) configured to execute instructions stored in the storage system 102 and further the host 106 can access data stored in the storage system 102.

Examples of the host 106 include computing devices such as a desktop computer, rack mounted server, a laptop, a smartphone, a tablet, or other suitable computing devices. Host 106 can also include systems and devices such as a gaming system, a digital phone, a digital camera (e.g., digital still cameras and digital movie cameras), portable media player, digital photo frame, remote control, television stick, smart television, and the like. Furthermore, the system architecture 100 can be implemented in a memory card such as secure digital (SD) card or a micro secure digital (micro-SD) card. In some embodiments, the system architecture 100 is embedded in the host, for example as a solid-state disk (SSD) drive installed in a laptop computer.

In embodiments where the system architecture 100 is implemented within a memory card, the host 106 can include a built-in receptacle for one or more types of memory cards or flash drives (e.g., a universal serial bus (USB) port, or a memory card slot). Additionally, or alternatively, the host 106 can include adapters into which a memory card may be plugged. The foregoing examples of a host are not meant to be limiting examples. On the contrary, a host 106 can include any type of device, system, and apparatus that accesses the storage system 102.

In FIG. 1A, the storage system 102 includes a memory controller and drivers (e.g., controller 104)—as will be described further below—however, in some embodiments of the storage system 102, the storage system 102 may include memory-only units that are instead controlled by software executed by a controller on the host 106 (e.g., a processor of a computing device controls, including error handling of, the storage system 102). Furthermore, although FIG. 1A illustrates the storage system 102 as separate from the host 106, in some embodiments, the storage system 102 is embedded with the host 106, where the memory, controller, and drivers are formed on a single integrated circuit chip.

The host 106 can communicate with the storage system 102 using of a bus 112 that implements any known or after developed communication protocol that enables the storage system 102 and the host 106 to communicate. The communication protocol may include Secure Digital (SD) protocol, Memory stick (MS) protocol, USB protocol, Advanced Microcontroller Bus Architecture (AMBA), or other suitable communication protocol.

In various embodiments, the controller 104 acts as an interface between the host 106 and the storage system 102. The host 106 may communicate with the controller 104 via a bus interface associated with the bus 112. The controller 104 can include individual circuit components, processing circuitry (e.g., logic gates and switches), a processor, a microprocessor, a microcontroller with controlling software, or a field programmable gate array (FPGA). Furthermore, the example controller 104 includes a computer-readable medium that stores computer-readable program code (e.g., software or firmware) executable by the processor. In some embodiments, the controller 104 is a flash memory controller. In some embodiments, the controller 104 is a processor executing within the host 106.

Still referring to FIG. 1A, according to some embodiments, the controller 104 acts as an interface between the host 106 and the storage system 102 and manages data stored on the storage system 102. For example, the host 106 can access data stored in the storage system 102 by providing a logical address, via the bus interface associated with the bus 112, to the controller 104, which, the controller 104 converts to a physical address. The controller 104 can access data and/or a particular storage location associated with the physical address and facilitate transferring data between the storage system 102 and the host 106. In some embodiments, where the storage system 102 includes flash memory, the controller 104 formats the flash memory to ensure the memory is operating properly, maps out bad flash memory cells, and allocates spare cells to be substituted for future failed cells or used to hold firmware to operate the flash memory controller (e.g., the controller 104).

Accordingly, the controller 104 performs various memory management functions such as wear leveling (e.g., distributing writes to extend the lifetime of the memory blocks), garbage collection (e.g., moving valid pages of data to a new block and erasing the previously used block), and error detection and correction (e.g., read error handling).

Still referring to FIG. 1A, the storage system 102 includes the non-volatile memory (NVM) block 110 which may include several memory die 110-1-110-N. In some embodiments, the NVM block 110 defines a physical set of memory die, such as the memory die 110-1-110-N. In other embodiments, the NVM block 110 defines a logical set of memory die, where the NVM block 110 includes memory die from several physically different sets of memory die. The manner in which the NVM block 110 is defined in FIG. 1A is not meant to be limiting.

Each memory die, for example memory die 110-1, includes non-volatile memory cells, such as NAND flash memory cells, NOR flash memory cells, or other suitable memory cells. As the memory cells are non-volatile, the memory cells in the storage system 102 retain data even when there is an interruption in power supplied to the memory cells and/or the storage system 102. Thus, the storage system 102 can be easily transported and the storage system 102 can be used in memory cards and other memory devices that are not always connected to a power supply.

In various embodiments, the memory cells in the memory die 110 are solid-state memory cells (e.g., flash) and are one-time programmable, few-time programmable, or many time programmable. Additionally, the memory cells in the memory die 110 can include single-level cells (SLC), multiple-level cells (MLC), or triple-level cells (TLC). In some embodiments, the memory cells are fabricated in a planar manner (e.g., 2D NAND (NOT-AND) flash) or in a stacked or layered manner (e.g., 3D NAND flash). That is, planar flash memory includes a single layer of memory cell, while stacked flash memory includes memory cells that are stacked vertically in multiple layers (e.g., referred to as planes).

In some embodiments, and as shown in FIG. 1A, the controller 104 and the NVM block 110 are communicatively coupled by an interface 114 that implements any known or after developed communication protocol. In embodiments where the storage system 102 is flash memory, the interface 114 is a flash interface, such as Toggle Mode 200, 400, 800, or Common Flash Memory Interface (CFI). In various embodiments, the interface 114 can be implemented by several channels (i.e., physical connections) disposed between the controller 104 and the individual memory die 110-1-110-N. Furthermore, the number of channels over which the interface 114 is established varies based on the capabilities of the controller 104. Additionally, a single channel can be configured to communicatively couple more than one memory die. The depiction of a single interface 114 is not meant to be limiting. To the contrary, the single interface is representative of an example interface that can be used between components, and one or more interfaces can be used to communicatively couple the same components.

Figure 1B:
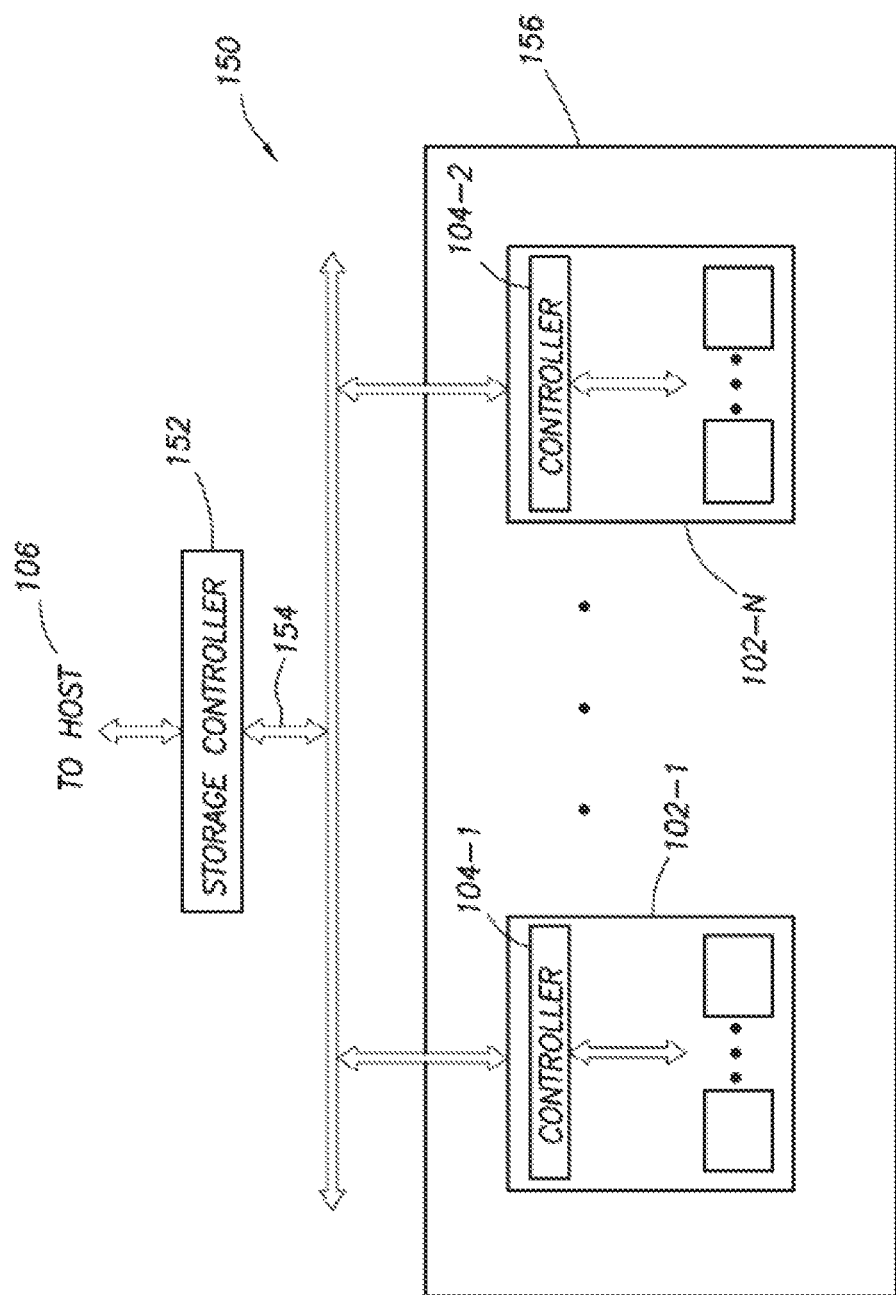

FIG. 1B generally illustrates a block diagram of a system architecture 100 according to the principles of the present disclosure. The system architecture 100 can be implemented as part of a larger system architecture. For example, as shown in FIG. 1B, the system architecture 150 includes a storage module 156 that further includes several storage systems 102. Within the example system architecture 150, the storage module 156 is communicatively coupled with the host 106 by way of a storage controller 152. In particular, an interface 154 between the host 106 and the storage module 156 includes a bus interface that implements any known or after developed communication protocol, such as a serial advanced technology attachment (SATA) or peripheral component interface express (PCIe) interface. In some embodiments, the storage module 156 is an SSD (e.g., in a laptop computer or a tablet).

Some implementations of the system architecture 100 include a hierarchical storage system. A hierarchical storage system can include a plurality of storage controllers 152, each of which control a respective storage system 102. Furthermore, a plurality of hosts 106 can each access the hierarchical storage system. Hosts 106 can access memories within the hierarchical storage system via a bus interface that implements any known or after developed communication protocol including a non-volatile memory express (NVMe) or a fiber channel over Ethernet (FCoE) interface. The hierarchical storage system can be implemented as a rack mounted storage system that is accessible by multiple host computers (e.g., a data center).

The interface 154 can be implemented by several channels (i.e., physical connections) disposed between the storage controller 152 and the storage module 156. In some embodiments, the number of channels over which an interface 154 is established varies based on the capabilities of the storage controller 152. The depiction of a single interface is not meant to be limiting and the single interface is representative of an example interface that can be used between components, where one or more interfaces can be used to communicatively couple various components.

Figure 2A:
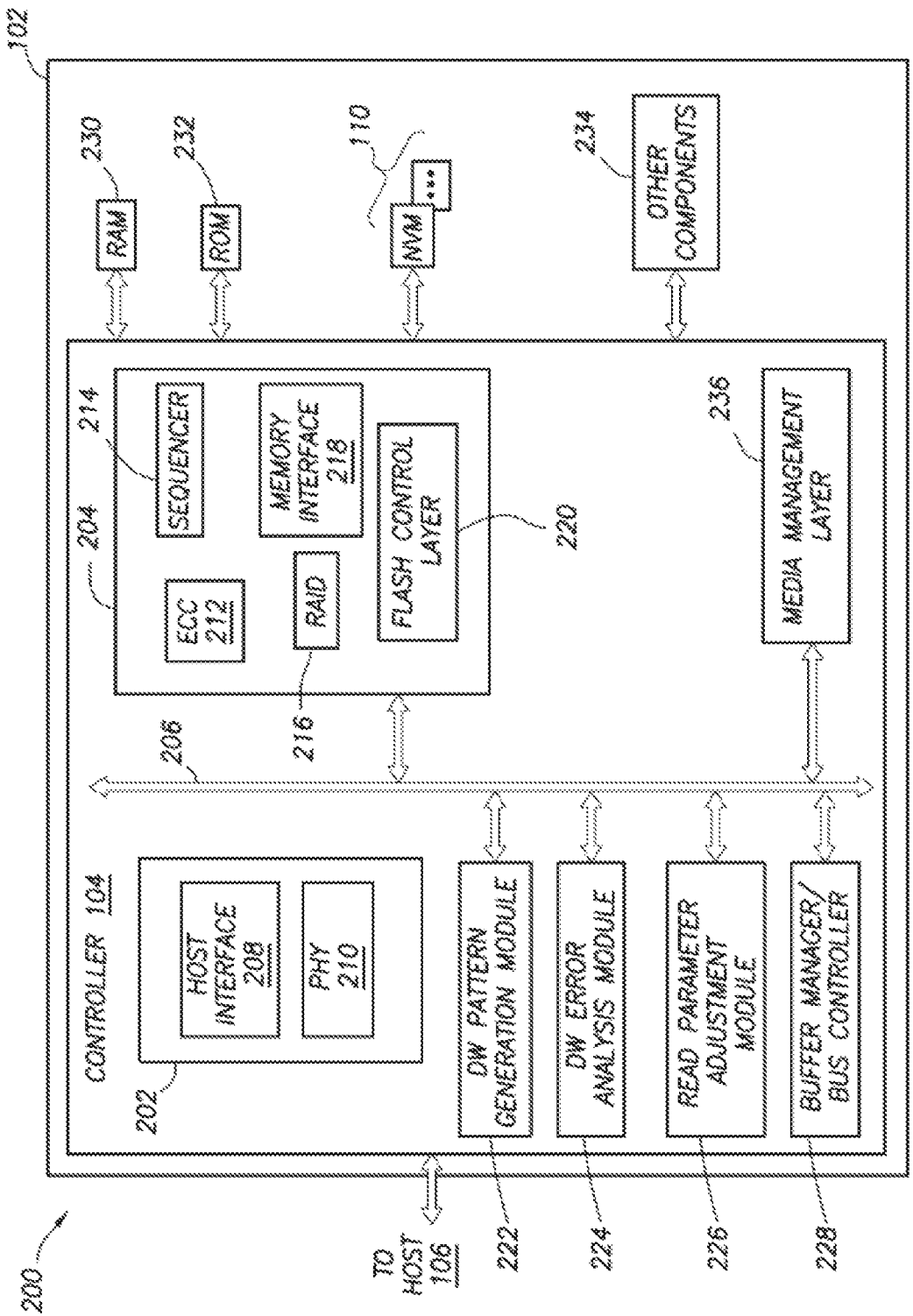
FIG. 2A generally illustrates a block diagram of example components of a controller according to the principles of the present disclosure.

FIG. 2A generally illustrates a block diagram 200 of the storage system 102, according to the principles of the present disclosure. The block diagram 200 of the storage system 102 includes components previously described in FIG. 1A, such as the controller 104 and the NVM memory block 110. Additional components that can be present within the storage system 102 include a random access memory (RAM) 230, a read only memory (ROM) 232, and other components 234. In some embodiments, the ROM 232 stores system boot code.

Although the RAM 230 and the ROM 232 are shown as separate modules within the storage system 102, the illustrated architecture is not meant to be limiting. For example, the RAM 230 and the ROM 232 can be located within the controller 104. In some embodiments, portions of the RAM 230 or ROM 232, respectively, are located outside the controller 104 and within the controller 104. In other embodiments, the controller 104, the RAM 230, and the ROM 232 can be located on separate semiconductor die. In various embodiments, the other components 234 include external electrical interfaces, external RAM, resistors, capacitors, logic gates, or other components that interface with the controller 104.

In some embodiments, the controller 104 includes a module 202 that interfaces with the host 106, a module 204 that interfaces with the NVM memory block 110, as well as various other modules, described further below. The modules within the controller (e.g., modules 202 and 204) are communicatively coupled to each other by a bus 206.

The following discussion of the various modules depicted within the controller 104 are meant to be illustrative and not limiting. For example, the various modules generally illustrated in FIG. 2A are not limited to being executed within the controller 104, and in some embodiments, one or more modules can be executed outside the controller 104.

The module 202 interfaces with the host 106 and includes a host interface 208 and a physical layer interface 210 that provides the electrical interface between the host 106 or next level storage controller and the controller 104. The host interface 208 facilitates transferring of data, control signals, and timing signals. Examples of the host interface 208 include SATA, SATA express, Serial Attached SCSI (SAS), Fibre Channel, USB, PCIe, and NVMe.

Still referring to FIG. 2A, in various embodiments, the module 204 is configured to communicate with the NVM block 110 and includes an error correcting code (ECC) engine 212. In some embodiments, the ECC engine 212 encodes data received from the host 106 and stores the encoded data in the NVM block 110. When the data is read out from the NVM memory block 110, the ECC engine 212 decodes the data and corrects errors detected within the data. To detect errors, the ECC engine 212 implements various types of error checking using algorithms such as low-density parity-check (LDPC) code, Bose-Chaudhuri-Hocquenghem (BCH) code, a soft read, and/or extra parity.

The example module 204 also includes a sequencer 214 and a Redundant Array of Independent Drives (RAID) module 216. In various embodiments, the sequencer 214 generates command sequences, such as program and erase command sequences that are transmitted to the NVM memory block 110. The RAID module 216 generates RAID parity and recovery of failed data. The RAID parity can be used to provide an additional level of integrity protection for data written into the NVM memory block 110. In some embodiments, the ECC engine 212 implements the functions of the RAID module 216.

The example module 204 also includes a memory interface 218 that provides the command sequences to the NVM memory block 110 and receives status information from the NVM memory block 110. For example, the memory interface 218 implements any known or after developed communication protocol including a double data rate (DDR) interface, such as a Toggle Mode 200, 400, or 800 interface. The module 204 also includes a flash control layer 220 that controls the overall operation of the module 204.

Still referring to example modules within the controller 104 in FIG. 2A, additional modules within the controller 104 includes a dummy word line (DW) pattern generation module 222, a DW error analysis module 224, and a read parameter adjustment module 226. Dummy word lines are placed on non-volatile memory die that are used for the purposes of analyzing and tracking behavior and health of a respective non-volatile memory die. In various embodiments, the DW pattern generation module 222 puts a known data pattern into a dummy word line and tracks or periodically check for errors by reading the data back out of the dummy word line and comparing the data to the known data pattern.

In various embodiments, the read parameter adjustment module 226 adjusts parameters associated with a particular non-volatile memory die. For example—and as discussed further below—the read parameters adjustment module 226 can adjust parameters associated with a particular non-volatile memory die during an operation—i.e., a read or write—to adjust or re-adjust the read parameters. During the operation to re-adjust the read parameters, the read parameter adjustment module 226 adjusts the read parameters for a particular memory block, reads data out of the memory block, and verifies a resulting BER. If the resulting BER falls at or below a target or expected BER, the read parameters adjustment module 226 stores the read parameters for the memory block. Subsequently, the stored read parameters are used during a read of any word line within the memory block. Thus, read parameters can be unique to a memory block.

Additional modules within the example controller 104 include a buffer manager/bus controller 228 that manages, for example, buffers in the RAM 230 and controls the internal bus arbitration of the bus 206 in the controller 104. Additionally, or alternatively, the controller 104 can include a media management layer 236 that performs wear leveling of the NVM memory block 110. As previously mentioned, the various modules described with respect to the controller 104 are not meant to be limiting as to the architecture of the controller 104. For example, the physical layer interface 210, the RAID module 216, the media management layer 236, and the buffer management/bus controller 228 can be examples of optional components within the controller 104.

Furthermore, in embodiments where the storage system 102 includes flash memory, the media management layer 236 can be integrated as part of the flash management that handles flash error and interfaces with the host 106. In particular, the media management layer 236 can include an algorithm (e.g., firmware in the memory device), that translates a write command received from the host 106 into a write to the NVM memory block 110.

Figure 2B:
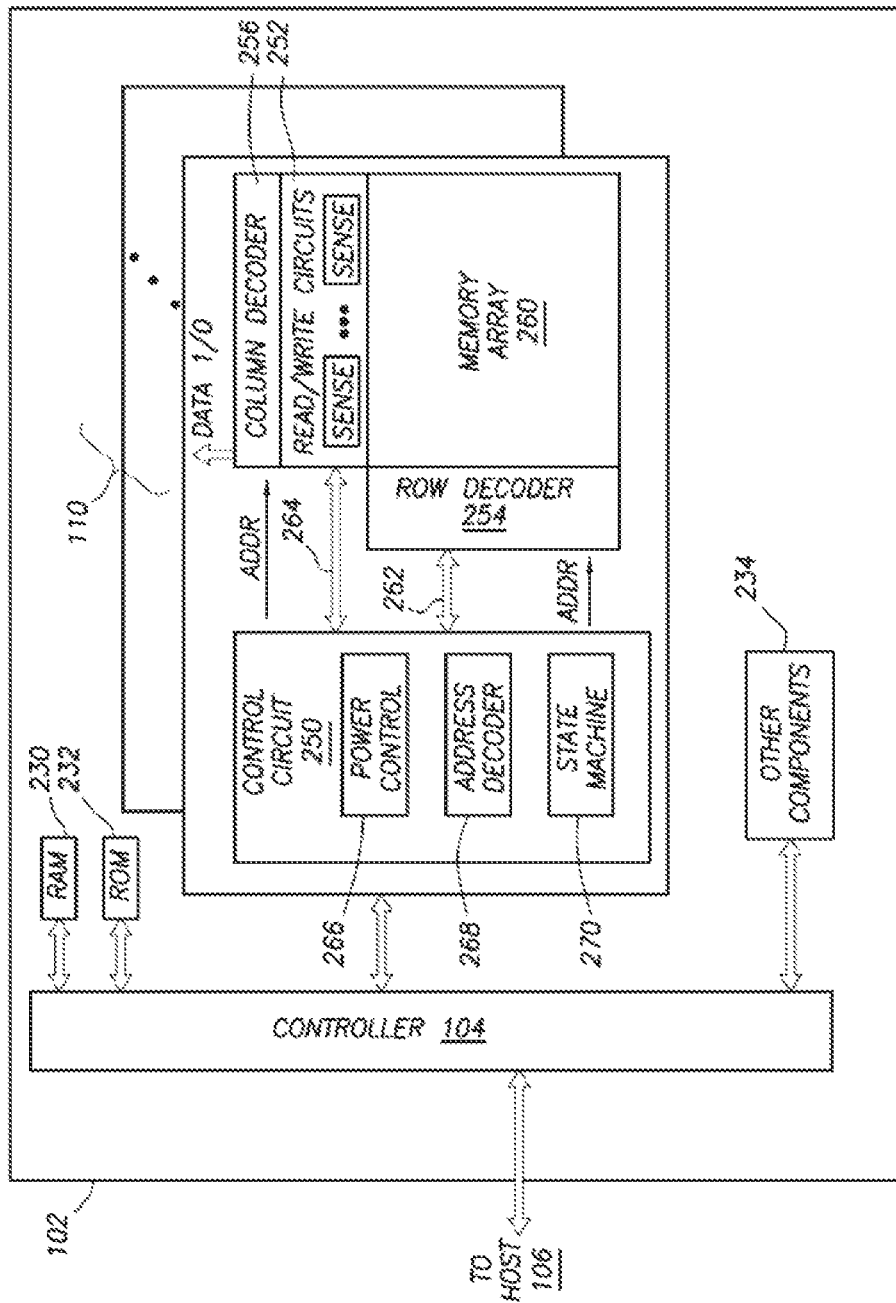
FIG. 2B generally illustrates a block diagram of example components of a non-volatile memory storage system according to the principles of the present disclosure.

FIG. 2B generally illustrates a block diagram with various features of the NVM memory block 110 within the storage system 102. As details of the controller 104 have been previously described (in FIG. 2A), in FIG. 2B the controller 104 is illustrated as a single block. Additionally, previously described RAM 230, the ROM 232, and the other components 234 are included in FIG. 2B to help orient the reader.

Next, details within an example memory die 110-1 are discussed. Although the discussion centers on the memory die 110-1, each of the features discussed in relation to the memory die 110-1 equally applies to all of the memory dies within NVM memory block 110.

In some embodiments, the example memory die 110-1 includes control circuit 250, read/write circuits 252, a row decoder 254, a column decoder 256, and a memory array 260. The memory array 260 can include a two-dimensional array or a three-dimensional array of memory cells. The read/write circuits 252 read and program pages of memory within the memory die 110-1, in parallel. In various embodiments, the memory array 260 is accessed by word lines via the row decoder 254 and by bit lines via the column decoder 256.

The architecture of the memory die 110-1 is not meant to be limiting and any known architecture that can perform the functions of accessing the memory array 260 can be used without departing from the scope of this disclosure. For example, in various embodiments, access to the memory array 260 by various peripheral circuits can be implemented in a symmetric fashion on opposite sides of the memory array 260, which reduces the densities of access lines, and circuitry on each side of the memory array 260.

Still referring to FIG. 2B, in various embodiments, the example control circuit 250 includes a power control circuit 266, an address decoder 268, and a state machine 270. In some embodiments, the power control circuit 266, the address decoder 268, and the state machine 270 can be collectively referred to as managing circuits. The control circuit 250 and its various managing circuits are communicatively coupled by various interfaces (e.g., interfaces 262 and 264) to the row decoder 254 and the column decoder 256. In various embodiments, the control circuit 250 performs various operations on the memory array 260 that include reading or writing to the memory cells.

The power control circuit 266 controls the power and voltage supplied to the word lines and bit lines during operation of the memory array 260. The address decoder 268 provides an address interface that translates addresses between addresses provided by the host 106 and addresses used by the row decoder 254 and the column decoder 256. The example address decoder 268 converts an address provided by the host 106 to an address that is understood and compatible with a format used by the row decoder 254 and the column decoder 256. The state machine 270 provides chip-level control of memory operations.

Thus, the storage system 102 includes various components including the controller 104 and the NVM memory block 110, details of which have been described above in FIGS. 1A, 1B, 2A, and 2B. The discussion now turns to an example architecture of an example memory array 260 and in particular methods that can be performed to improve a performance of a read in the storage system 102.

FIG. 3 further illustrates the memory array 260. The memory array 260 is divided into several memory blocks 302. In flash memory, a memory block is defined as a unit of erase. That is, each memory block 302 includes a number of memory cells that are erased together or as a block. In some embodiments, the memory array 260 can be partitioned into any number of blocks, for example, the memory array 260 includes 1,024 blocks. Additionally, or alternatively, each of the memory blocks 302 can conceptually be divided into a number of pages defined as a unit of programming. In some embodiments, a page of data can be stored in one row of memory cells. Each page can include user data and overhead data, where the overhead data includes CC that has been calculated from the user data. In some embodiments, the memory blocks 302-1 to 302-N may include solid-state NAND memory blocks.

Each memory block 302, for example memory block 302-1, includes multiple bit lines 304, word lines 306, and select lines 308. Each bit line, for example bit line 304-1, is connected to several memory cells connected in series. More particularly, in an embodiment where each memory cell is a floating gate transistor, the floating gate transistors are connected in series to form a NAND string 310 (e.g., illustrated within the dashed box). Although four memory cells are shown in FIG. 3, the number of memory cells within the NAND string is not meant to be limiting. For example, 16, 32, 64, 128, or any other number of memory cells can be connected in a NAND string. Each respective bit line 304 is coupled to a respective NAND string within the block 302.

Still referring to FIG. 3, a method of reading data stored in a particular memory cell—e.g., memory cell 316—includes applying a voltage to the select lines 308 of the block 302, which in turn are coupled to respective NAND strings within the block 302, including the NAND string 310 the includes the memory cell 316. The voltage applied to the select lines 308 is greater than threshold voltages of the select transistors 312 and 314. The select transistor 312 is controlled by the select gate drain line (SGD) 308-1 and the select transistor 314 is controlled by the select gate source line (SGS) 308-2. Additionally, in order to read data in the memory cell 316, all other memory cells or unselected memory cells in the NAND string 319 are turned on (e.g., conducting current regardless of whether they are programmed or erased). The unselected memory cells have a read pass voltage—i.e., read parameters—applied to their respective word lines that turn on the unselected memory cells.

During the example read operation, various read compare levels—i.e., voltages—are applied to the word line 306-2 to determine the value stored in the memory cell 316. In some embodiments, the conduction current of the memory cell 316 is measured to determine the value stored within the memory cell 316. The method in which each memory cell is accessed and the number of memory cells accessed during a read or write varies. For example, all of the bit lines of the memory block 302-1 can be simultaneously programmed or read. In various embodiments, memory cells along a shared word line can be programmed at the same time (i.e., concurrently). In other embodiments, the bit lines can be divided into even bit lines and odd bit lines. In an odd/even bit line architecture, memory cells along a shared word line and connected to the odd bit lines are programmed at one time, while memory cells along a shared word line and connected to an even bit line are programmed at a different time.

Each time data is written to a memory block the data is processed by the ECC engine 212 which includes encoding the data (e.g., using a particular error correction code) and storing the encoded data in the memory block. When the data is read back out of the memory block, the data is processed by the ECC engine 212 which includes decoding the data, correcting errors (e.g., tracked as the BER), and returning the data to a user (by way of the controller 104). In some embodiments, the amount of time the ECC engine 212 takes to return data to the controller 104 is defined as the throughput time.

In some embodiments, the controller 104 performs data consolidation operations on the memory array 260. The controller 104 selects a source block from the memory block 302-1 to memory block 302-N of the memory array 260, for consolidation or compaction. For example, the controller 104 may select memory block 302-1 as the source block for consolidation or compaction. The memory block 302-1 may be referred to as the source block 302-1 throughout the example embodiments described herein. The source block 302-1 may include a plurality of memory fragments, such as 16 memory fragments or any suitable number of memory fragments. The memory fragments may include data written by the host 106 during a host write operation. The memory fragments may belong to respective logical groups and may be scattered or disorganized in the source block 302-1, such that memory fragments associated with the same logical group may not be sequentially stored or organized in the source block 302-1. Additionally, or alternatively, while some memory fragments include data written by the host 106 during a host write operation, other memory fragments scattered throughout the source block 302-1 may be blank (e.g., having been erased by the host 106 or the controller 104 or having not been written to by the host 106).

As described, the storage system 102 may include one or more charge pumps that generate voltages used by the controller 104 to perform operations, such as erase operations, programming operations, write operations, read operations, and the like on one or more memory cells of the memory blocks 302-1 to 302-N. The charge pump may increase or decrease a supply voltage and provide voltage pulses (e.g., using the increased or decreased voltage) to the memory cells. For example, the charge pump may double the voltage from the supply voltage, triple the voltage from the supply voltage, half the voltage from the supply voltage, or increase or decrease the voltage from the supply voltage to any suitable factor of the supply voltage in order to generate voltage pulses at a voltage required for performing operations the memory cells.

In some embodiments, the charge pump is connected to one or more capacitors. For example, the charge pump may be connected to the one or more capacitors in parallel or series. In some embodiments, the charge pump may be connected to some capacitors in parallel and some capacitors in series. During a first pulse of the charge pump operation, the charge pump, using the supply voltage, may charge the one or more capacitors (e.g., bringing the capacitor to the same voltage as the supply voltage). The charge pump may include or be connected to a suitable switching device.

The charge pump may use the switching device to reconfigure the connection between the charge pump and the one or more capacitors, which may change the way the one or more capacitors are connected to the charge pump (e.g., from series to parallel, parallel to series, or a combination thereof). During a second pulse of the charge pump, the charge pump may supply voltage from the voltage supply to the one or more capacitors (e.g., being charged to the voltage of the voltage supply) which may double the voltage at the one or more capacitors. It should be understood that the charge pump may be connected to any number of capacitors in any suitable fashion and may use the supply voltage and the switching device to charge the capacitors to any suitable voltage. Additionally, or alternatively, the charge pump may use any number of pulses to charge the capacitors. The controller 104 may use the voltage stored in the capacitors by the charge pump to program the memory cells.

In some embodiments, the controller 104 is configured to determine whether a fault has occurred (e.g., previously occurred or is currently occurring) or will occur in the storage system 102. The fault may include memory leakage, component damage (e.g., to components of the storage system 102), data loss (e.g., during programming of the memory blocks 302-1 to 302-N or after programming the memory blocks 302-1 to 302-N), other faults, or a combination thereof. The controller 104 may use clock cycle counts associated with the charge pump to determine whether faults will occur or have occurred in the storage system 102.

Figure 4:
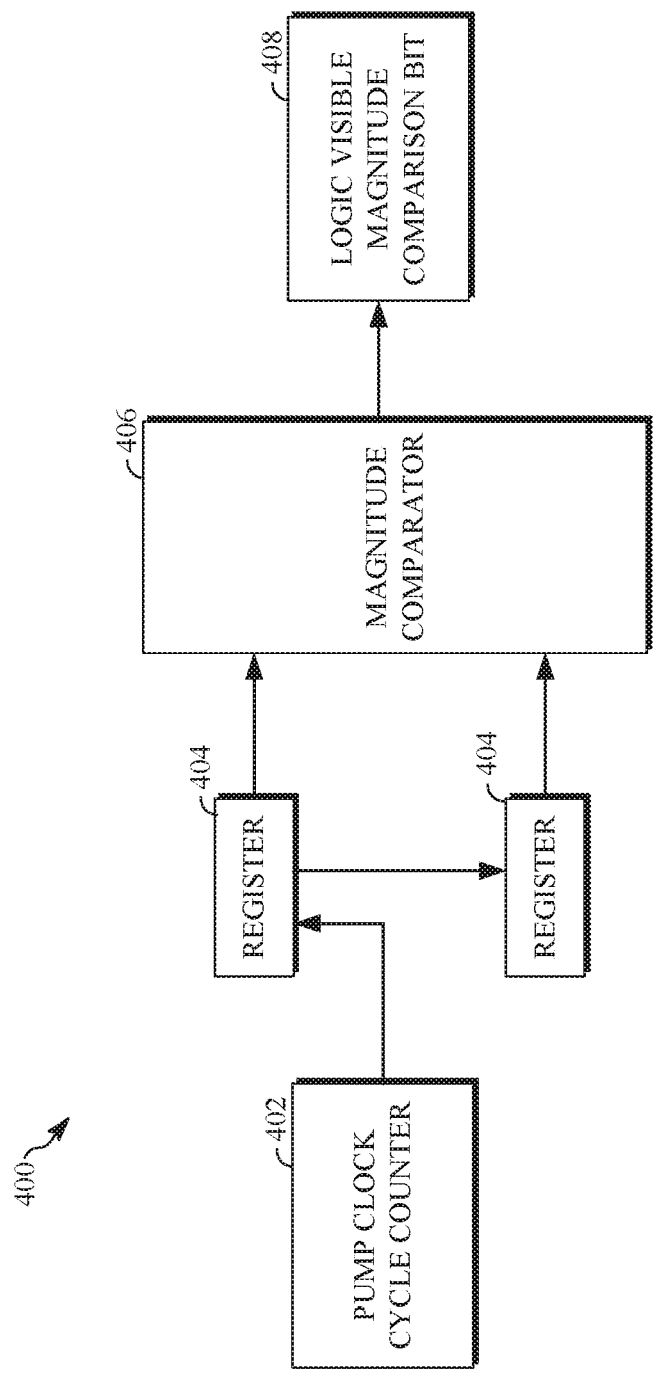
FIG. 4 generally illustrates a digital clock cycle counter circuit according to the principles of the present disclosure.

For example, the charge pump may include a clock cycle counter circuit. In some embodiments, the clock cycle counter circuit may include a digital clock cycle counter circuit, such as the circuit 400 generally illustrated in FIG. 4. The circuit 400 may include at least one pump clock cycle counter 402, a plurality of registers 404, a magnitude comparator 406, and a logic visible magnitude comparison bit 408. In some embodiments, the circuit 400 includes more than one pump clock cycle counter 402. Additionally, or alternatively, the circuit 400 may include additional or fewer components than those described herein.

The pump clock cycle counter 402 is configured to count clock cycles (e.g., the number of processor cycles) for each pulse of the charge pump. The pump clock cycle counter 402 stores a value corresponding to the clock cycle counts in the registers 404. For example, the pump clock cycle counter 402 may store a clock cycle count value corresponding to a current pulse of the charge pump in a first register 404. During a subsequent pulse of the charge pump, the first register 404 may communicate (e.g., or the controller 104 or other suitable mechanism may copy or move) the value of the clock cycle count corresponding to the current pulse to a second register 404. The pump clock cycle counter 402 counts and stores a clock cycle count value corresponding to the subsequent pulse of the charge pump in the first register 404. In some embodiments, the pump clock cycle counter 402 may store samples of clock cycle counts (e.g., for 2, 4, 8, 16, or other suitable number of cycles) in the registers 404. In some embodiments, the second register 404 may store two or more previous clock cycle count values. For example, bits of the second register 404 may be wired one to the left such that the next register will be shifted left by one bit.

The registers 404 communicate (e.g., or the controller 104 or other suitable mechanism may copy or move) the clock cycle values to the magnitude comparator 406. The magnitude comparator 406 may include an 8-bit comparator, a 16-bit comparator, or any suitable comparator. The magnitude comparator 406 is configured to receive the clock cycle values (e.g., in binary form) and determine whether the clock cycle value corresponding to the second pulse is greater than, less than, or equal to the clock cycle value corresponding to the first pulse. The magnitude comparator 406 may then store a value to the logic visible comparison bit 408. The value stored in the logic visible comparison bit 408 corresponds to a difference between the clock cycle count values. In some embodiments, the circuit 400 may include use other math comparison methods in addition to or instead of the magnitude comparator 406. For example, the circuit 400 may include an op-amp and may use an analog math method associated with the op-amp and/or the circuit 400 may use other digital math operations to alter inputs from the registers 404 to the magnitude comparator 406.

In some embodiments, the controller 104 is configured to determine whether a fault will occur or has occurred in the storage system 102 based on the value stored in the logic visible comparison bit 408. For example, the controller 104 compares the value stored in the logic visible comparison bit 408 to a threshold value. When the controller 104 determines that the value stored in the logic visible comparison bit 408 is greater than the threshold value (e.g., when the value stored in the logic visible comparison bit 408 is significantly large because the clock cycle count value of the second pulse is significantly larger than the clock cycle count of the first pulse), the controller 104 determines that a fault may occur or has occurred in the storage system.

In some embodiments, the controller 104 is configured to compare clock cycle count values stored in the registers 404 and determine whether a fault will occur or has occurred in the storage system 102 based on the comparison. For example, the controller 104 receives a first clock cycle count value from the first register 404 and a second clock cycle counter value from the second register 404. The controller 104 determines a difference between the first clock cycle count value and the second clock cycle value. The controller 104 compares the difference to a threshold value. When the controller 104 determines that the difference is greater than the threshold value, the controller 104 determines that a fault will occur or has occurred in the storage system 102.

In some embodiments, the controller 104 is configured to determiner whether a fault will occur or has occurred in the storage system, mid-pulse. For example, the controller 104 is configured to receive a first clock cycle count value corresponding to a first pulse of the charge pump from the first register 404. The controller 104 is configured to receive a second clock cycle count value corresponding to a number of clock cycles counting at substantially the middle of a second pulse of the charge pump. As described, the controller 104 is configured to determine whether a difference between the first clock cycle count value and the second clock cycle count value is greater than the threshold value. When the controller 104 determines that the difference is greater than the threshold value, the controller 104 determines a fault will occur in the storage system 102. In this manner, the controller 104 may determine whether a fault will occur or has occurred in the storage system 102 before the end of a corresponding pulse of the charge pump (e.g., mid pulse).

In some embodiments, the controller 104 is configured to determine whether a fault will occur or has occurred in the storage system 102 based on a variation in effort of the charge pump over time. For example, each pulse of the charge pump includes a plurality of stages, such as a voltage ramp up stage, a stead state stage, and a voltage ramp down stage. During the voltage ramp up stage, the clock cycle counts may be expected to be variable. However, during the steady state stage, the clock cycle counts may be expected to be substantially the same for a given period.

The controller 104 may be configured to compare clock cycle counts for respective portions of a charge pump pulse. For example, the controller 104 may determine a difference between a first clock cycle count associated with a first portion of a pulse operating in the steady state stage and a second clock cycle count associated with a second portion of the pulse operating in the steady state stage. The controller 104 may compare the difference between the first clock cycle count and the second clock cycle count to a first predetermined threshold. When the controller 104 determines that the difference between the first clock cycle count and the second clock cycle count is above the first predetermined threshold, the controller 104 determines that a fault may occur in the storage system 102. In some embodiments, the controller 104 may compare the difference between the first clock cycle count and the second clock cycle count to a second predetermined threshold. The second predetermined threshold may be larger than the first predetermined threshold. When the controller 104 determines that the difference between the first clock cycle count and the second clock cycle count is above the second threshold, the controller 104 determines that a fault has occurred or is more likely to occur in the storage system 102.

As described, the storage system 102 may include one or more memory layers (e.g. memory planes). The controller 104 may perform operations, such as those described above, on corresponding memory blocks of respective memory layers in parallel or substantially in parallel. When the controller 104 performs an operation on multiple memory layers, the expected effort of the charge pump may be change (e.g., increase by 20% or other suitable value). As described, the controller 104 determines whether a fault occurred or will occur based on a comparison of a difference between a first clock cycle count and a second clock cycle count and a threshold value. The threshold value may be different (e.g., greater) when the controller 104 is performing operations on more than one memory layer than when the controller 104 is performing operations on one memory layer. Additionally, or alternatively, the controller 104 may determine a number of memory layers the operation will be performed on and select or receive a threshold value corresponding to the number of memory layers. In some embodiments, the controller 104 may adjust the threshold value based on the number of memory layers being used to perform the operations.

In some embodiments, the storage system 102 may include single-layer memory cells, multi-layer memory cells, triple-layer memory cells, quad-layer memory cells, and the like. The threshold value may vary based on the memory cell type. In some embodiments, the controller 104 may determine the memory cell type and select or receive a threshold value corresponding to the memory cell type. In some embodiments, the controller 104 may determine a threshold value for a memory cell type using a threshold value for a single-layer memory cell. For example, the controller 104 may determine an expected value (e.g., corresponding to the threshold value) for single-layer memory cells by performing operations on the single-layer memory cells and monitoring the clock cycle counts of the charge pump (e.g., during normal operation). The controller 104 may then determine a corresponding threshold value for multi-layer memory cells by multiplying the expected value by a factor corresponding to the multi-layer memory cells (e.g., the factor may be three for triple-layer memory cells, and so on).

In some embodiments, the controller 104 may selectively adjust the threshold value based on a number of remaining cells to be programmed. For example, the expected effort of the charge pump may vary depending on the number of cells to be programmed. Accordingly, the controller 104 may increase or decrease the threshold value to correspond to the expected effort of the charge pump based on the number of cells to be programmed. Additionally, or alternatively, the controller 104 may increase or decrease the threshold value to correspond to an expected effort of the charge pump based on a pulse count corresponding to performing a respective operation.

In some embodiments, the controller 104 may selectively adjust the threshold value based on a temperature of the storage system 102 (e.g., or of one or more components of the storage system 102), a chronological age of the storage system 102, a total number of cycles run on the storage system 102, a bit error rate of the storage system 102, or a combination thereof. For example, as the storage system 102 increases in age, number of cycles performed increases, or the bit error rate increases, the expected effort of the charge pump may change. Accordingly, the controller 104 may adjust the threshold value to correspond to the change in expected effort of the charge pump. Additionally, or alternatively, as a temperature of the storage system 102 increases or decreases, the expected effort of the charge pump may change. Accordingly, the controller 104 may adjust the threshold value to correspond to the change in expected effort of the charge pump.

In some embodiments, the threshold value may be based on multiplier estimators for clock cycles of the charge pump. In some embodiments, the threshold value may be based on non-multiplier estimators for clock cycles of the charge pump, rather than constant multipliers, such as offsets multipliers, logarithmic multipliers, geometric multipliers, exponential function multipliers, or other suitable multiplier or function.

As described, the fault may indicate that the storage system 102 may have memory leakage, data loss, component damage, or a combination thereof. In some embodiments, the fault may indicate that the charge pump is operating at a full duty cycle during operation and was unable to reach a target voltage (e.g., a voltage required for performing operations on the memory blocks 302-1 to 302-N). In order to prevent damage to components of the storage system 102 (e.g., including the charge pump), and to prevent memory leakage and/or data loss, the controller 104 is configured to initiate and/or execute one or more corrective actions in response to the determination that a fault will occur or has occurred in the storage system 102. For example, the controller 104 may instruct the charge pump to shut down in response to a determination that a fault will occur or has occurred in the storage system 102. The fault may indicate that the charge pump is operating at the full duty cycle. The controller 104 may suspend the operation being performed on the memory cells of the memory blocks 302-1 to 302-N and/or the controller 104 may set a flag or other indication indicating that a fault will occur or has occurred in the storage system 102.

In some embodiments, the controller 104 may perform the methods described herein. However, the methods described herein as performed by the controller 104 are not meant to be limiting, and any type of software executed on a controller can perform the methods described herein without departing from the scope of this disclosure. For example, a controller such as a processor executing software within the host 106 or firmware within the storage system 102 (e.g., stored on ROM 232 or NVM memory block 110) can perform the methods described herein.

Figure 5:
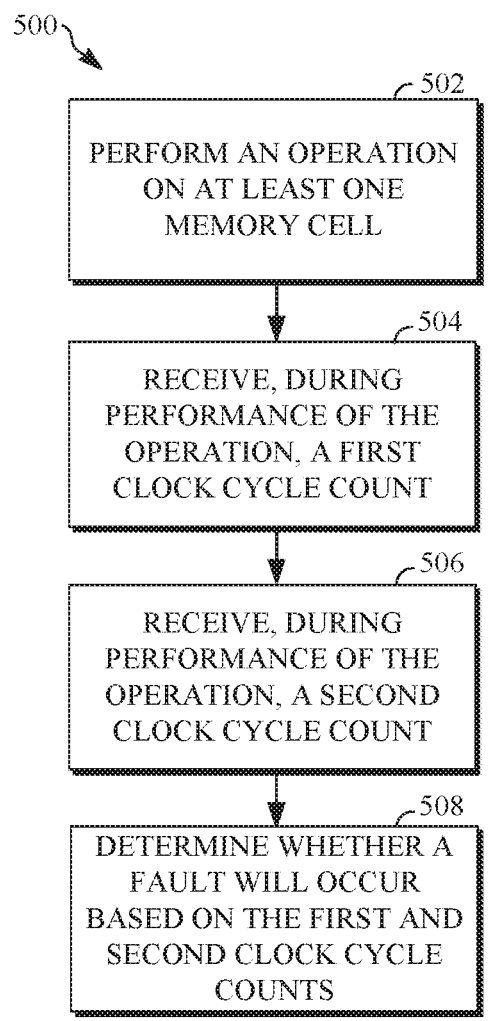
FIG. 5 is a flow diagram illustrating a memory fault detection method according to the principles of the present disclosure.

FIG. 5 is a flow diagram illustrating a memory fault detection method 500 according to the principles of the present disclosure. At 502, the method 500 performs an operation on at least one memory cell. For example, the controller 104 may perform an operation, such as a high-voltage operation (e.g., a programming operation) on at least one memory cell of the memory blocks 302-1 to 302-N. At 504, the method 500 receives, during performance of the operation, a first clock cycle count. For example, the controller 104 may receive, from the first register 404, a first clock cycle count value corresponding to a first pulse of the charge pump. At 506, the method 500 receives, during performance of the operation, a second clock cycle count. For example, the controller 104 may receive, from the second register 404, a second clock cycle count value corresponding to at least a portion of a second pulse of the charge pump (e.g., the second clock cycle count value corresponds to either the number of clock cycles during entire second pulse or mid-way through the second pulse).

At 508, the method 500 determines whether a fault will occur or has occurred based on the first and second clock cycle counts. For example, the controller 104 determines a difference between the first and second clock cycle count values. The controller 104 determines whether the difference is above a threshold. The controller 104 determines that a fault will occur or has occurred in the storage system 102 in response to the difference being above the threshold. The controller 104 may initiate and/or execute at least one corrective action in response to the determination that the fault will occur in the storage system 102.

In some embodiments, a method for detecting faults in a memory system includes performing an operation on at least one memory cell of the memory system. The method also includes receiving, during performance of the operation, a first clock cycle count for a first pulse of a charge pump associated with the at least one memory cell. The method also includes receiving, during performance of the operation, a second clock cycle count for a second pulse of the charge pump. The method also includes determining whether a fault will occur based on a difference between the first clock cycle count and the second clock cycle count.

In some embodiments, the operation includes a high-voltage operation. In some embodiments, determining whether the fault will occur based on the difference between the first clock cycle count and the second clock cycle count includes comparing the difference to a threshold and determining that the fault will occur in response to the difference being above the threshold. In some embodiments, the second clock cycle count is determined before an end of the second pulse of the charge pump. In some embodiments, the fault will occur is determined before the end of the second pulse of the charge pump. In some embodiments, the method also includes, in response to a determination that the fault will occur, initiating a corrective action. In some embodiments, the corrective action includes suspending performance of the operation. In some embodiments, the corrective action includes adjusting a behavior of the charge pump. In some embodiments, the corrective action includes completing performance of the operation and setting a flag indicating that the fault will occur.

In some embodiments, a controller includes a bus interface and a processor. The bus interface is in communication with at least one charge pump clock counter associated with a charge pump. The processor is in communication with the bus and configured to: perform an operation on at least one memory cell of a memory system associated with the controller; receive, during performance of the operation, a first clock cycle count for a first pulse of the charge pump; receive, during performance of the operation, a second clock cycle count for a second pulse of the charge pump; and determine whether a fault will occur based on a difference between the first clock cycle count and the second clock cycle count.

In some embodiments, the operation includes a high-voltage operation. In some embodiments, the processor is further configured to compare the difference to a threshold and determine that the fault will occur in response to the difference being above the threshold. In some embodiments, the processor is further configured to determine the second clock cycle count before an end of the second pulse of the charge pump. In some embodiments, the processor is further configured to determine whether the fault will occur before the end of the second pulse of the charge pump. In some embodiments, the processor is further configured to initiate a corrective action in response to a determination that the fault will occur. In some embodiments, the corrective action includes suspending performance of the operation. In some embodiments, the corrective action includes adjusting a behavior of the charge pump. In some embodiments, the corrective action includes completing performance of the operation and setting a flag indicating that the fault will occur.

In some embodiments, a fault determination circuit includes a charge pump clock cycle counter configured to count clock cycles of a charge pump associated with a memory system. The circuit also includes a first register that receives a first clock cycle count from the charge pump clock cycle counter, wherein the first clock cycle count corresponds to a first pulse of the charge pump. The circuit also includes a second register that receives a second clock cycle count from the charge pump clock cycle counter, wherein the second clock cycle count corresponds to a second pulse of the charge pump. The circuit also includes a magnitude comparator configured to compare the first clock cycle count to the second clock cycle count.

In some embodiments, an output of the magnitude comparator indicates whether a fault will occur in the memory system.

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications. In the preceding description and in the claims, the terms "including" and "comprising" are used in an open-ended fashion, and thus should be interpreted to mean "including, but not limited to . . . ." In addition, the term "couple" or "couples" is intended to mean either an indirect or a direct connection. Thus, if a first device couples to a second device, that connection may be through a direct connection or through an indirect connection via other devices and connections.

The word "example" is used herein to mean serving as an example, instance, or illustration. Any aspect or design described herein as "example" is not necessarily to be construed as preferred or advantageous over other aspects or designs. Rather, use of the word "example" is intended to present concepts in a concrete fashion. As used in this application, the term "or" is intended to mean an inclusive "or" rather than an exclusive "or." That is, unless specified otherwise, or clear from context, "X includes A or B" is intended to mean any of the natural inclusive permutations. That is, if X includes A; X includes B; or X includes both A and B, then "X includes A or B" is satisfied under any of the foregoing instances. In addition, the articles "a" and "an" as used in this application and the appended claims should generally be construed to mean "one or more" unless specified otherwise or clear from context to be directed to a singular form. Moreover, use of the term "an implementation" or "one implementation" throughout is not intended to mean the same embodiment or implementation unless described as such.

Implementations the systems, algorithms, methods, instructions, etc., described herein can be realized in hardware, software, or any combination thereof. The hardware can include, for example, computers, intellectual property (IP) cores, application-specific integrated circuits (ASICs), programmable logic arrays, optical processors, programmable logic controllers, microcode, microcontrollers, servers, microprocessors, digital signal processors, or any other suitable circuit. In the claims, the term "processor" should be understood as encompassing any of the foregoing hardware, either singly or in combination. The terms "signal" and "data" are used interchangeably.

As used herein, the term module can include a packaged functional hardware unit designed for use with other components, a set of instructions executable by a controller (e.g., a processor executing software or firmware), processing circuitry configured to perform a particular function, and a self-contained hardware or software component that interfaces with a larger system. For example, a module can include an application specific integrated circuit (ASIC), a Field Programmable Gate Array (FPGA), a circuit, digital logic circuit, an analog circuit, a combination of discrete circuits, gates, and other types of hardware or combination thereof. In other embodiments, a module can include memory that stores instructions executable by a controller to implement a feature of the module. In some embodiments, the controller 104 is implemented within the host 106 can be configured with hardware and/or firmware to perform the various functions described herein.

"Controller" shall mean individual circuit components, an application-specific integrated circuit (ASIC), a microcontroller with controlling software, a digital signal processor (DSP), a processor with controlling software, a field programmable gate array (FPGA), or combinations thereof.

Further, in one aspect, for example, systems described herein can be implemented using a general-purpose computer or general-purpose processor with a computer program that, when executed, carries out any of the respective methods, algorithms, and/or instructions described herein. In addition, or alternatively, for example, a special purpose computer/processor can be utilized which can contain other hardware for carrying out any of the methods, algorithms, or instructions described herein.

Further, all or a portion of implementations of the present disclosure can take the form of a computer program product accessible from, for example, a computer-usable or computer-readable medium. A computer-usable or computer-readable medium can be any device that can, for example, tangibly contain, store, communicate, or transport the program for use by or in connection with any processor. The medium can be, for example, an electronic, magnetic, optical, electromagnetic, or a semiconductor device. Other suitable mediums are also available.

The above-described embodiments, implementations, and aspects have been described in order to allow easy understanding of the present invention and do not limit the present invention. On the contrary, the invention is intended to cover various modifications and equivalent arrangements included within the scope of the appended claims, which scope is to be accorded the broadest interpretation to encompass all such modifications and equivalent structure as is permitted under the law.

What is claimed is:

1. A method for detecting faults in a memory system, the method comprising:
   performing an operation on at least one memory cell of the memory system, wherein the operation is defined as having a voltage source from a charge pump, and during performance of the operation:
   receiving a first clock cycle count for a first pulse of the charge pump associated with the at least one memory cell, and storing the first clock cycle count in a first register,
   transferring the first clock cycle count from the first register to a second register and storing the first clock cycle count in the second register, receiving a second clock cycle count for a second pulse of the charge pump, and storing the second clock cycle count in the first register, and determining whether a fault will occur based on a difference between the first clock cycle count and the second clock cycle count.

2. The method of claim 1, wherein the storing the first clock cycle count in the second register comprises shifting bits of the second register one to the left.

3. The method of claim 1, wherein the determining whether the fault will occur comprises:

comparing the difference between the first clock cycle count and the second clock cycle to a first threshold, if the difference is larger than the first threshold, comparing the difference to a second threshold larger than the first threshold, and determining that the fault will occur in response to the difference being above the second threshold.

4. The method of claim 1, wherein the second clock cycle count is determined before an end of the second pulse of the charge pump.

5. The method of claim 4, wherein whether the fault will occur is determined before the end of the second pulse of the charge pump.

6. The method of claim 1, further comprising, in response to a determination that the fault will occur, initiating a corrective action.

7. The method of claim 6, wherein the corrective action includes suspending performance of the operation.

8. The method of claim 6, wherein the corrective action includes adjusting a behavior of the charge pump.

9. The method of claim 6, wherein the corrective action includes completing performance of the operation and setting a flag indicating that the fault will occur.

10. The method of claim 1, wherein the determining that the fault will occur comprises determining that a target voltage was not reached, and in response to a determination that the fault will occur, initiating a corrective action comprising adjusting a behavior of the charge pump.

11. A memory device comprising:

a memory cell array;

a charge pump configured to provide a pumping voltage signal during an operation on at least one memory cell of the memory cell array;

a digital clock cycle counter circuit comprising:

a pump clock cycle counter; configured to count a first clock cycle count for a first portion of a first pulse of the charge pump during the operation and configured to count a second clock cycle count for a second pulse of the charge pump during the operation;

a first register configured to store the first clock cycle count received from the pump clock cycle counter, to transfer the first clock cycle count to a second register, and to store the second clock cycle count received from the pump clock cycle counter;

the second register configured to store the first clock cycle count;

a magnitude comparator; configured to receive the second clock cycle count from the first register and receive the first clock cycle count from the second register, to compare the first clock cycle count and the second clock cycle count, and to output a value corresponding to a difference between the first clock cycle count and the second clock cycle count; and a controller configured to determine whether a fault will occur based on a difference between the first clock cycle count and the second clock cycle count.

12. The controller of claim 11, wherein the controller is configured to determine whether the fault will occur by;

comparing the difference to a first threshold;

if the difference is larger than the first threshold, comparing the difference to a second threshold larger than the first threshold; and determine that the fault will occur in response to the difference being above the second threshold.

13. The memory device of claim 11, wherein the controller is configured to determine whether the fault will occur before the end of the first pulse of the charge pump.

14. The memory device of claim 11, wherein the the controller is further configured to initiate a corrective action in response to a determination that the fault will occur.

15. The memory device of claim 14, wherein the corrective action includes suspending performance of the operation.

16. The memory device of claim 14, wherein the corrective action includes adjusting a behavior of the charge pump.

17. The memory device of claim 14, wherein the corrective action includes completing performance of the operation and setting a flag indicating that the fault will occur.

18. The memory device of claim 11, wherein the second register is configured to store the first clock cycle count by shifting bits of the second register one to the left.

19. The memory device of claim 11, wherein the controller is configured to determine that a target voltage was not reached upon determining that a fault will occur, and the controller is further configured to initiate a corrective action comprising adjusting a behavior of the charge pump.

* * * * *